United States Patent
Chen et al.

(10) Patent No.: US 10,068,040 B2
(45) Date of Patent: *Sep. 4, 2018

(54) METHOD AND APPARATUS FOR TRANSACTION RECORDING AND VISUALIZATION

(71) Applicants: Synopsys Taiwan Co., Ltd., Taipei (TW); Synopsys, Inc., Mountain View, CA (US)

(72) Inventors: Yung Chuan Chen, Taipei (TW); I-Liang Lin, Taipei (TW); Li-Chi Chang, Taipei (TW); Bindesh Patel, San Diego, CA (US)

(73) Assignee: SYNOPSYS, INC., Mountain View, CA (US)

( * ) Notice: Subject to any disclaimer, the term of this patent is extended or adjusted under 35 U.S.C. 154(b) by 347 days.

This patent is subject to a terminal disclaimer.

(21) Appl. No.: 14/791,216

(22) Filed: Jul. 2, 2015

(65) Prior Publication Data
US 2016/0110484 A1    Apr. 21, 2016

Related U.S. Application Data

(63) Continuation of application No. 13/047,007, filed on Mar. 14, 2011, now Pat. No. 9,081,924.

(60) Provisional application No. 61/318,627, filed on Mar. 29, 2010.

(51) Int. Cl.
G06F 17/50    (2006.01)
G06F 11/36    (2006.01)

(52) U.S. Cl.
CPC ...... G06F 17/5022 (2013.01); G06F 11/3672 (2013.01)

(58) Field of Classification Search
CPC combination set(s) only.
See application file for complete search history.

(56) References Cited

U.S. PATENT DOCUMENTS 9,582,625 B2 *    2/2017    Agarwala ........... G06F 17/5045

* cited by examiner

Primary Examiner — Aniss Chad
(74) Attorney, Agent, or Firm — Alston & Bird LLP

(57) ABSTRACT

Methods and apparatus for recording and visualizing transactions of a test bench simulation are disclosed. Transaction-specific data generated from a test bench simulation may be displayed in a sequence diagram view to provide a view of the transactions arranged sequentially in time.

14 Claims, 21 Drawing Sheets

METHOD AND APPARATUS FOR TRANSACTION RECORDING AND VISUALIZATION

This Application is a Continuation of U.S. application Ser. No. 13/047,007, filed on Mar. 14, 2011, which Application claims the benefit of priority under 35 U.S.C. § 119(e) of U.S. Provisional Application Ser. No. 61/318,627, filed on Mar. 29, 2010, the contents of which are incorporated by reference herein in their entirety.

TECHNICAL FIELD

This disclosure relates to methods and apparatus for recording and visualizing transaction-specific data for a test bench simulation.

BACKGROUND

The Open Verification Methodology (OVM) and Universal Verification Methodology (UVM) are examples of standard transaction-based methodologies used to verify semiconductor chip designs. The OVM test bench environment typically includes, for example, the hardware or device under test (DUT) and the software or test bench including clocks, signals sent, and signals received. The methodologies are transaction-based, meaning that transactions between test bench components are constructs that represent different states of a signal. For example, a transaction representing a memory write command may include the address, verify, write, etc. A transaction may include higher level transactions as well as lower level transactions.

Transaction data for a simulation recorded in a fast signal database (FSDB) may be opened in a waveform view, and example of which is shown in FIG. 1. A waveform view allows an integrated circuit designer to visualize the signal transitions over time and the relationship of those signals with other signals in an integrated circuit design. In the OVM waveform view, transactions are typically shown as boxes with each box containing detailed information about a specific transaction for an individual component. For a particular component, the boxes containing transaction information are arranged in relative temporal order. While the waveform view provides a visualization of the relative temporal sequence of transactions for a particular component and between components of a DUT, the waveform view does not readily provide a sense of the absolute temporal sequence of transactions for the simulation.

Various other views of a simulation have also been developed to facilitate vent of integrated circuit design. For example, a temporal flow view (TFV) provides a sequential view of hardware components, state diagrams show the relationship between hardware components, and Unified Modeling Language (UML) diagrams may provide information about structure, behavior, and/or interactions of and/or between the system components.

For example, digital logic hardware events may be displayed in sequential temporal order using tools such as SpringSoft Novas Temporal Flow View (TFV). On the software side, tools such as Unified Modeling Language (UML) provide graphical representations of software systems. An example of a UML sequence diagram is shown in FIG. 2. In particular, the UML sequence diagram shows test bench components and the interactions between these components in their relative sequential temporal order. The primary use of UML has been to document a program or system. However, to facilitate system design verification it may be useful to generate and display interactions representing the dynamic behavior of a test bench simulation.

SUMMARY

The information of interest to the integrated circuit designer in a sequence diagram is the test bench components (OVM or UVM objects) and the transactions passing between these components. Using existing verification tools, detailed information about all transactions and test bench components including information concerning which test bench components are sending and receiving transaction-specific data may be recorded. A sequence diagram view may be generated from the data stored in the debug database during a test bench simulation and then displayed to provide an alternative and more intuitive view of the test bench behavior. When used in conjunction with traditional hardware-focused waveform views, a sequence diagram view provided by the present disclosure may serve as a useful tool for system development engineers to analyze, debug, and understand the design and verification environment of a DUT.

Leveraging System Verilog code, a flexible logging function that records messages into a debug database, an OVM library may be modified and implemented to automatically log transaction-level activity between an interface such as a sequencer making a request and a driver returning a response. In this manner each request transaction may be associated with a response transaction. While this information may be useful to a user in the context of waveform and table views of the simulation, the availability of transaction-specific information enables the user to generate a sequence diagram view of the specific transactions in simulation time that provides a more intuitive view of the test bench activity.

In a first aspect, methods are disclosed comprising running a simulation comprising transactions on a device under test, wherein the simulated transactions comprises multiple test bench components; generating a transaction database as a response to the simulation, wherein the transaction database comprises transaction-specific data elements for a specific transaction between the test bench components; generating a sequence diagram from the transaction database, wherein an element of the sequence diagram comprises a temporal relationship between two or more of the transaction-specific data elements; and displaying the sequence diagram, wherein the displayed sequence diagram comprises displaying at least two test bench components and displaying transactions between the at least two test bench components arranged temporally.

In a second aspect, apparatus are disclosed comprising a simulator for simulating transactions on a device under test, wherein the simulation comprises multiple test bench components; a transaction database for storing simulation results from the simulator, wherein the transaction database comprises transaction-specific data elements for a specific transaction between the test bench components; a sequence diagram generator for generating a sequence diagram from the transaction database, wherein an element of the sequence diagram comprises a temporal relationship between two or more of the transaction-specific data elements; and an output device for displaying the sequence diagram, wherein the displayed sequence diagram comprises an image of at least two test bench components and transactions between the at least two test bench components arranged temporally.

It is to be understood that both the foregoing general description and the following detailed description are exemplary and explanatory only and are not restrictive of the claimed embodiments.

BRIEF DESCRIPTION OF THE DRAWINGS

The accompanying drawings, which are incorporated in and constitute a part of this specification, illustrate embodiments consistent with the present disclosure and, together with the description, serve to explain the principles of the disclosed embodiments. Those skilled in the art will understand that the drawings, described herein, are for illustration purposes only. The drawings are not intended to limit the scope of the present disclosure.

DESCRIPTION OF THE EMBODIMENTS

Figure 1:
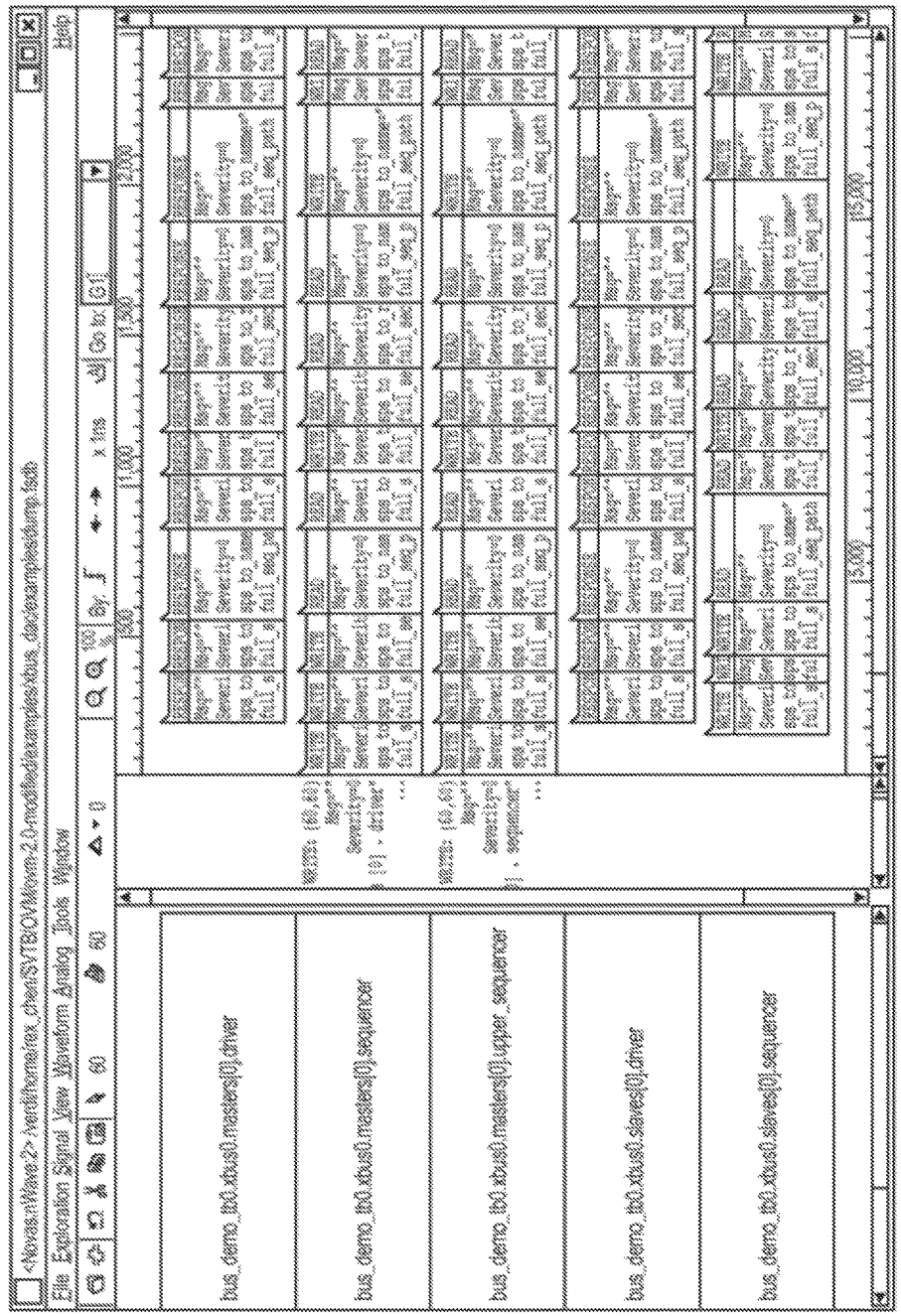
FIG. 1 shows an OVM waveform view of a test bench simulation.
Figure 2:
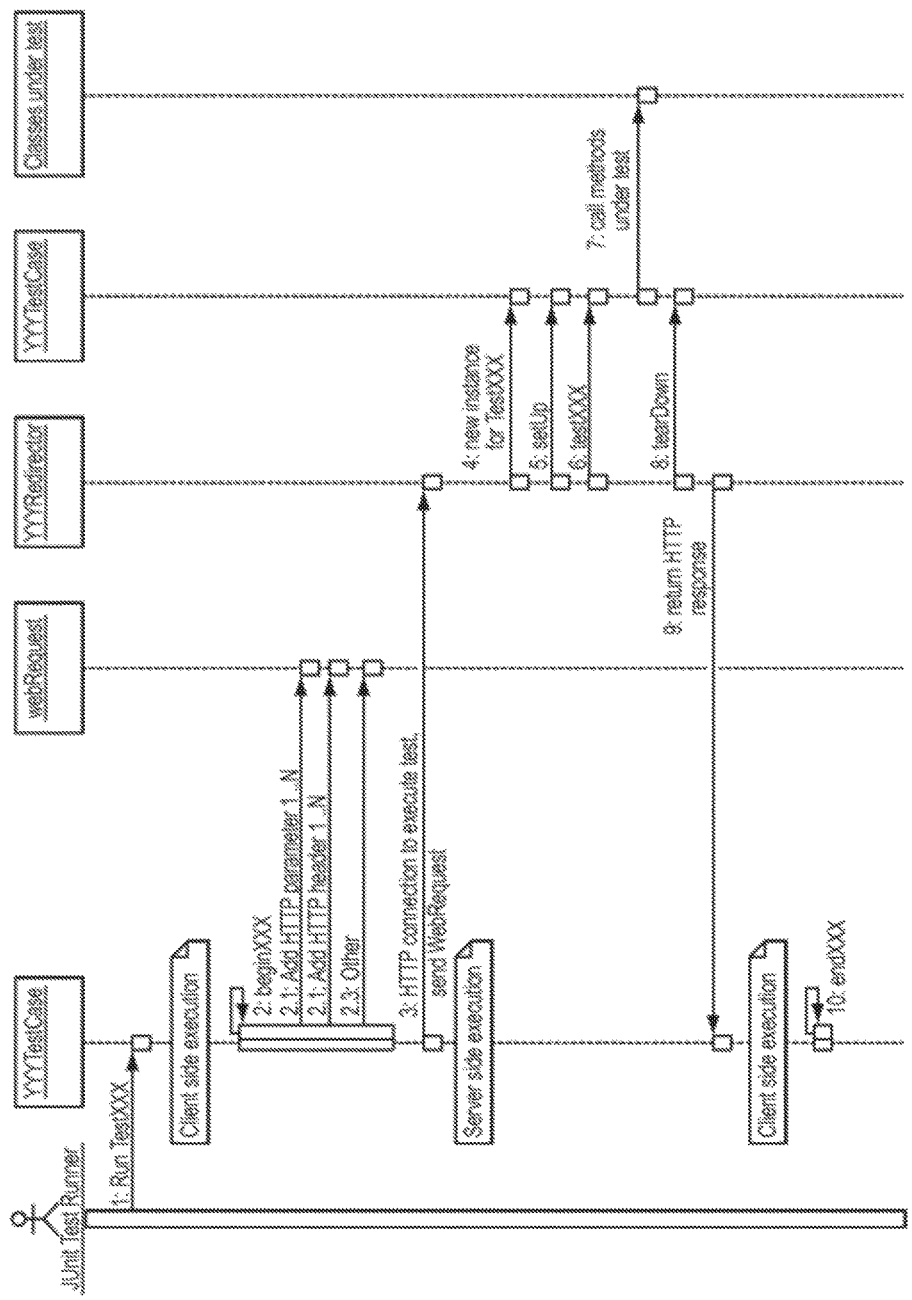
FIG. 2 illustrates a UML sequence diagram with horizontal boxes representing software components, relative execution order on the vertical axis, and interactions between software components shown as arrows.

Reference will now be made in detail to certain embodiments, examples of which are illustrated in the accompanying drawings.

The components of an OVM-based transaction-level verification environment include a stimulus generator (sequencer) to create transaction-level traffic to a device under test (DUT), a driver to convert these transactions to signal-level stimuli at the DUT interface, a monitor to recognize signal-level activity on the DUT interface and to convert the activity into transactions, and an analyzer, such as a coverage collector or scoreboard, to analyze the transactions. In a typical SystemVerilog test bench there is a driver and one or more levels of sequencers. Transactions represent, for example, data passed between sequencers and between the lower-level sequencer and the driver. In general, it is useful to obtain data for the transactions between the sequencer and the driver, and between the monitor and the analyzer. Other transactions may also be of interest. The OVM library provides functions for extracting and recording information in the FSDB. Various OVM library commands may be defined and enabled by the user to generate a transaction database. For example, OVM library commands may be assigned transaction recording functions so that running a simulation will then result in transaction-specific data being recorded and stored in the FSDB.

During a simulation, transactions may be automatically recorded using the OVM transaction recording infrastructure. OVM library functions may be modified to provide a modified OVM library. Users may then link to the modified OVM library and apply the existing OVM (or UVM) transaction recording methodology to automatically record transaction-specific data to the FSDM file. For example, empty functions within the OVM library may be used to record the transactions and store transaction-specific data in a transaction data base. For example, empty OVM functions that may be implemented to record and store transaction-specific data include, for example, "ovm_create_fiber", "ovm_set_index_attribute_by_name", "ovm_set_attribute_by_name", "ovm_check_handle_kind, ovm_begin_transaction", "ovm_end_transaction, ovm_link_transaction", "ovm_free_transaction_handle", and others. The functions may be implemented to automatically record transactions during a simulation. For example, the following modified functions may be defined to record and store transaction-specific data:

"ovm_create_fiber": Given a name, create a stream on which transactions are recorded.

"ovm_set_index_attribute_by_name": Not used.

"ovm_set_attribute_by_name": Add a named attribute to this transaction. Invoked by "ovm_component::end_tr( )". For the monitor and driver, the user calls this application programming interface manually.

"ovm_check_handle_kind": Return 1 if the type of the given 'handle' is htype, otherwise return 0. Legal hytpes are 'Stream' and 'Transaction'.

"ovm_begin_transaction": Return a handle to a new transaction. The new transaction has attributes such as whether it is active, the name, start time (now or at "begin_time"), label, and description.

"ovm_end_transaction"; Given an open transaction handle, end it. If "end_time" is non-zero, then end the transaction at "end_time".

"ovm_link_transaction": Given two transaction handles, create a relationship between the handles.

"ovm_free_transaction_handle": Given a transaction handle, release storage for the transaction. Calling "free_transaction_handle( )" means that the handle is no longer to be used anywhere; after this call the transaction handle is invalid.

To enable transaction recording and storing, a user may first invoke the modified OVM library using function "ovm_misc.sv" by adding the command "set_confi_int("*", "recording_detail", OVM_FULL)" in the build function of the test bench, which calls the command "void'(this.begin_tr( )) and ovm_component::end_tr( )" in the driver and monitor. Other functions and/or command definitions may be used to record and store the transaction-specific data to the FSDB.

The transactions may then be displayed, for example, in a waveform view showing all transactions between an interface such as between the sequencer and the driver for an OVM test bench. However, the modified OVM library may also be instrumented to automatically record information between a test bench component making a request (sequencer) with a test bench component returning a response (driver). In this way each request transaction may be associated with a response transaction. While this information is useful to the user in the context of the waveform view and the table view, the availability of such complete information may facilitate creating other views of the test bench activity such as a sequence diagram view.

Figure 3:
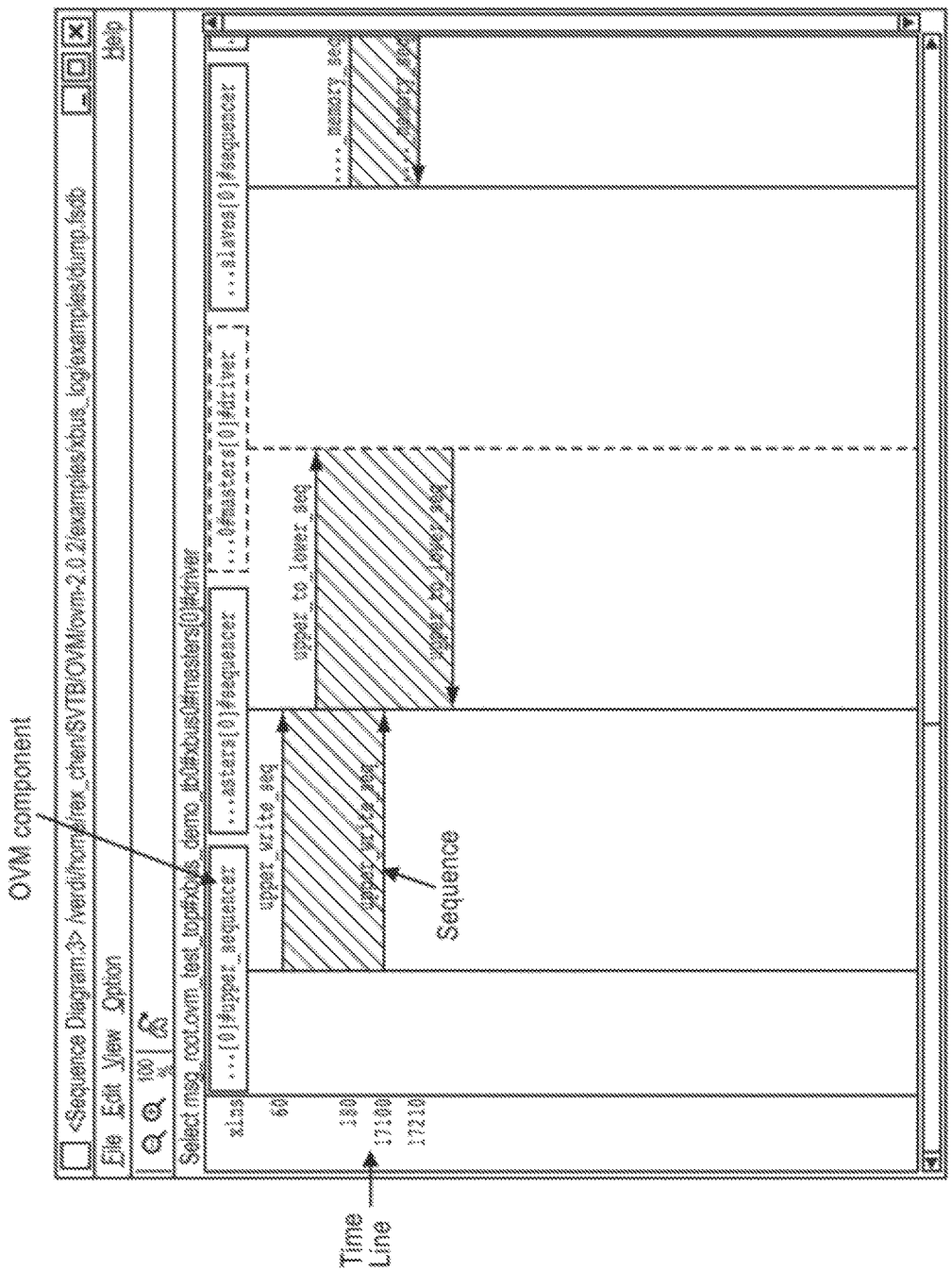
FIG. 3 illustrates a sequence diagram view showing the high-level transactions (lined areas) between OVM test bench components and with simulation time on the vertical axis.

An example of an OVM sequence diagram view of the test bench activity is shown in FIG. 3. In FIG. 3, the absolute time during the simulation (simulation time) is shown increasing from top to bottom on the left side of the image. A list of test bench components is displayed horizontally along the top of the sequence diagram. Transactions between test bench components are shown as blocks bounded by arrows pointing from the sending component to the receiving component. The blocks are also referred to as a sequence. A sequence represents a higher level transaction that includes one or more lower level transactions.

Transaction-specific data elements include, for example, the name of the specific transaction, the start time of the specific transaction, an end time or duration of the specific transaction, the interface on which the specific transaction takes place, the name of a variable associated with the specific transaction, and the value for the named variable associated with the specific transaction at an identified time. The interface on which a specific transaction takes place includes, for example, the name of a test bench component making a request and the name of a test bench component returning a response to the request. The test bench components may be, for example, one or more sequencers and one or more drivers. The sequence diagram may be displayed to show transactions between at least two components as an identifier relating the at least two components at the time the transaction occurred during the simulation. For example, as shown in FIG. 3, in certain embodiments, the identifier may be a horizontal arrow between the two components. Examples of displayed transactions include data that is passed between two sequencers and data that is passed between a sequencer and a driver. A displayed transaction may represent a single lower level transaction or may represent a higher level transaction consisting of multiple lower level transactions. A higher level transaction may be an intermediate higher level transaction such that the intermediate higher level transaction is an element of a still higher level transaction.

Figure 4:
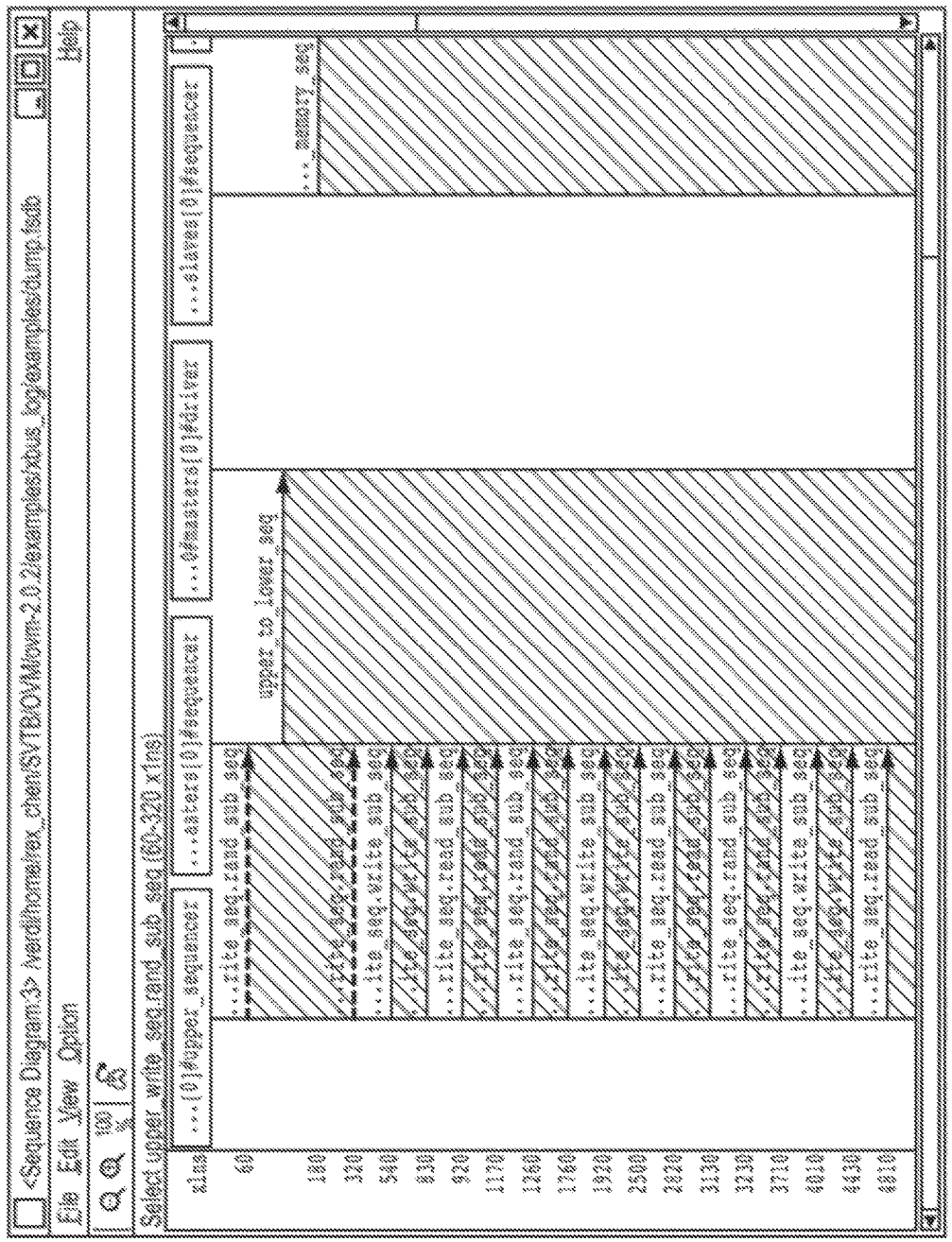
FIG. 4 illustrates an expanded sequence showing multiple lower-level transactions relating to the selected corresponding high-level transaction (bold dashed horizontal arrows for " . . . rite_seq.rand_sub_seq").
Figure 5:
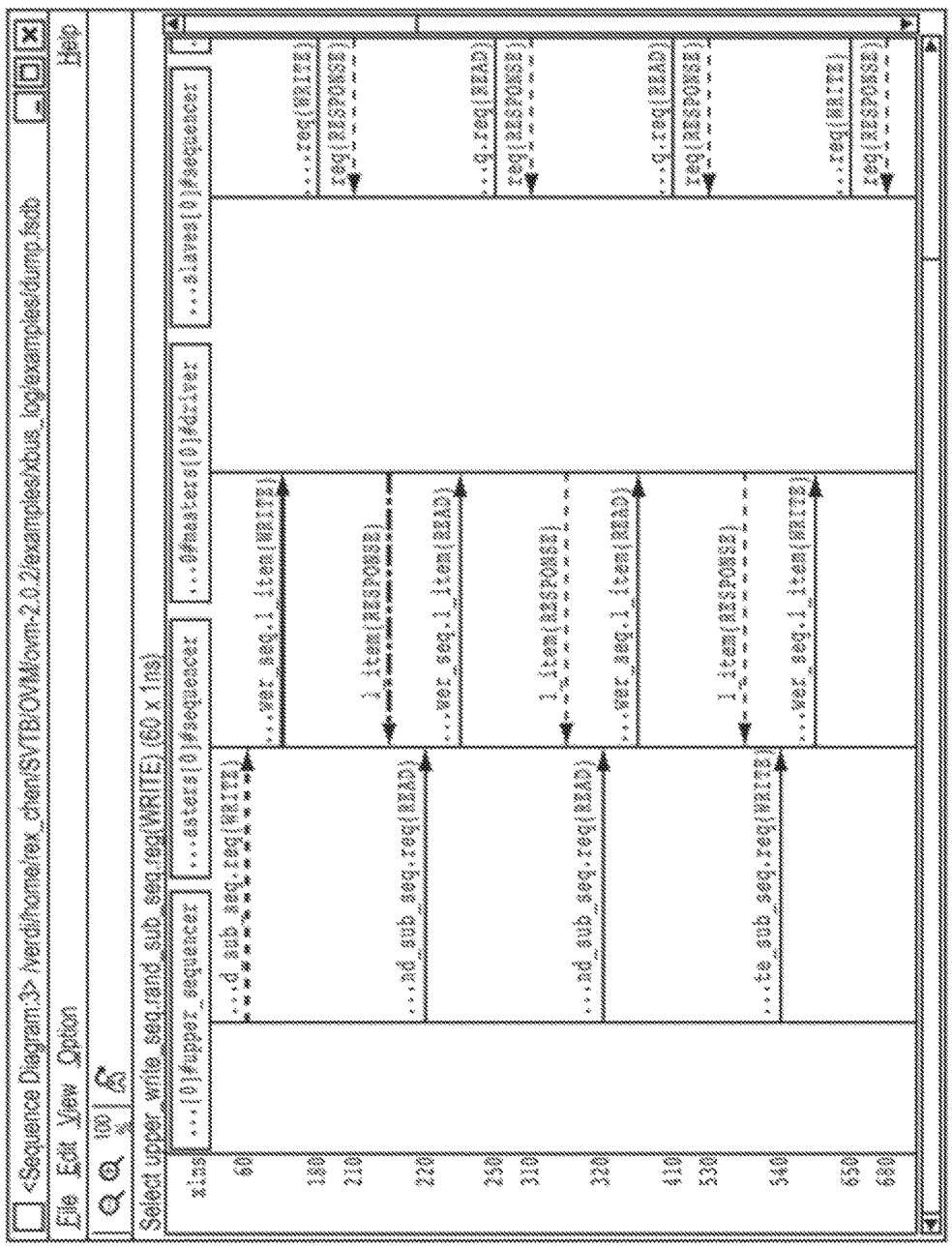
FIG. 5 illustrates a full expansion of a single high-level transaction to show all transactions relating to a selected transaction (bold dashed horizontal arrow for " . . . d_sub_seq.req(WRITE)") and the request(s) (bold solid arrow for " . . . wer_seq.1_item(WRITE)") and response(s) (bold dashed arrow for "1_item(RESPONSE)") corresponding to the selected transaction.

A sequence/transaction may be selected and expanded to show the multiple lower level transactions. The lower level transactions include transactions between the two components that were initiated by a transaction that occurs earlier in simulation time. For example, referring to FIG. 3, by selecting the sequence between component . . . [0]#upper_sequencer and component . . . asters[0]#sequencer, the sequence may be expanded to show transactions at the next lower level, as shown in FIG. 4. Selecting a transaction may be done, for example, by activating a cursor while pointing at a specific transaction or by hovering a cursor over the specific transaction or sequence. Also, as shown in FIG. 4, the selected transaction may be highlighted. Other lower level transactions may be visualized by selecting the desired sequence. For example, by selecting the sequence " . . . rite_seq.rand_sub_seq" at simulation time 60 in FIG. 4, the sequence may be expanded to show the lower level transactions associated with the sequence arranged in order during simulation time as shown in FIG. 5. Again, the selected transaction as well as the request(s) and response(s) corresponding to the selected transaction may be highlighted. Specifically, as shown in FIG. 5, at time 60, component . . . [0]#upper_sequencer sends command "d_sub_seq.req(WRITE)" to component . . . asters[0]#sequencer. The command prompts a request "wer_seq.1_item (WRITE)" from component asters . . . [0]#sequencer to component . . . 0#masters[0]#driver, which returns response "1_item(RESPONSE)" to component . . . asters[0]#sequencer.

Figure 6:
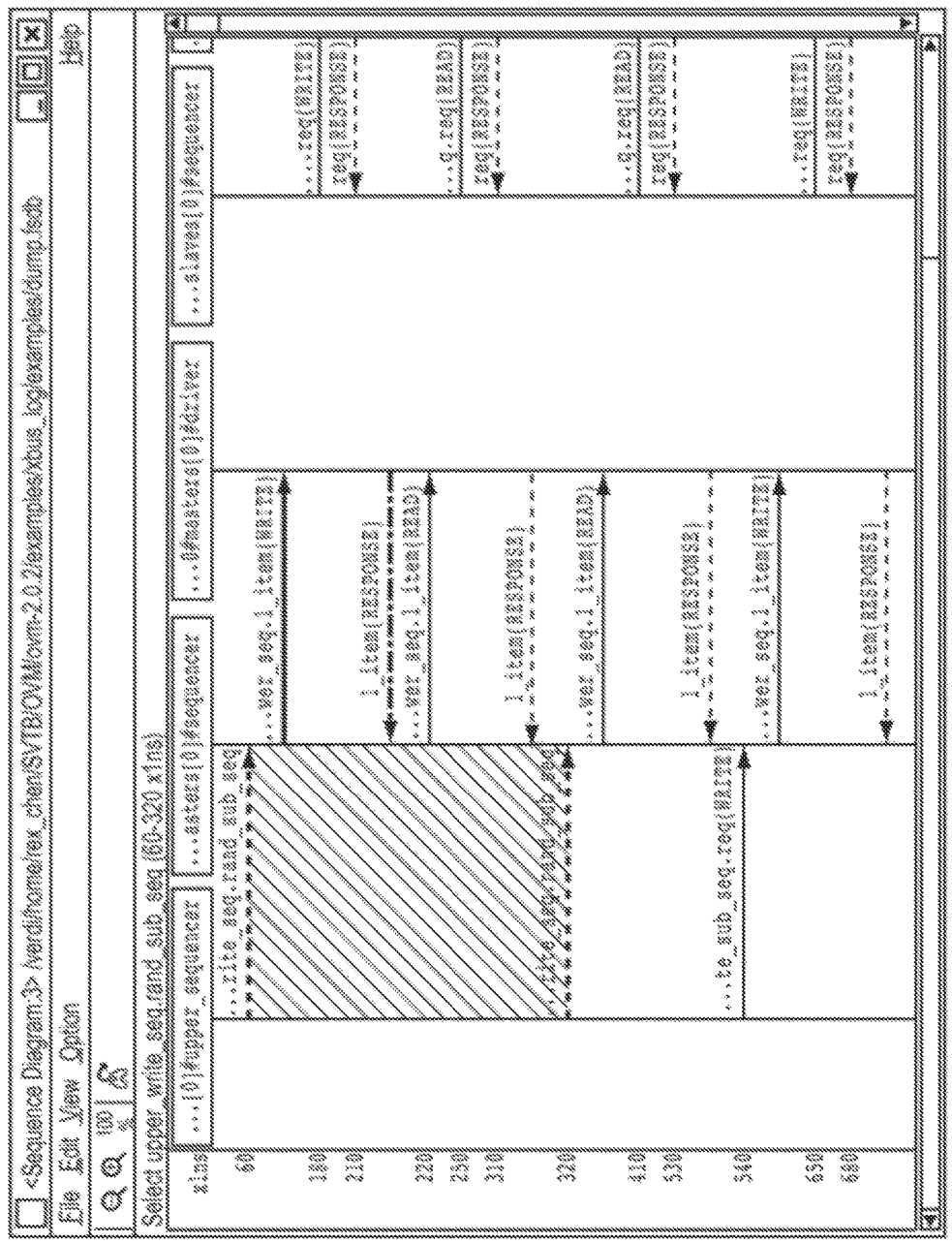
FIG. 6 illustrates a collapsed view of multiple selected transactions (lined area).
Figure 7:
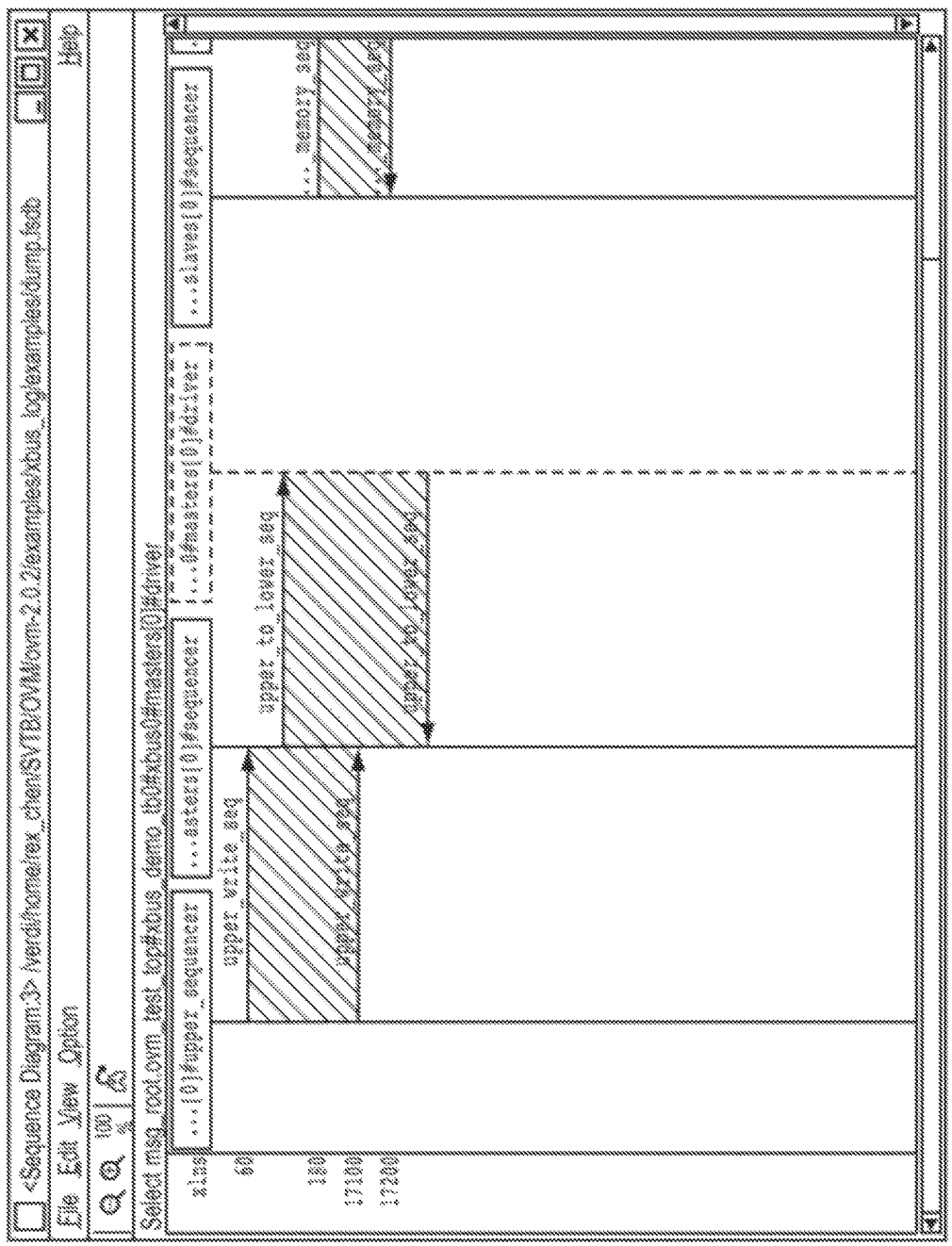
FIG. 7 illustrates a collapsed view of all transactions.

In addition to expanding a higher level transaction to show lower level transactions encompassed by the higher level transaction, multiple lower level transactions may be collapsed into their corresponding higher level transaction. For example, referring to FIG. 5, selecting the transaction " . . . nd_sub_seq.req(READ)" at time 320 in FIG. 5 collapses or hides the intermediate transaction " . . . nd_sub_seq.req(READ)" into the higher level sequence shown in FIG. 6. As shown in FIG. 7, all transactions corresponding to selected transaction " . . . nd_sub_seq.req(READ)" may be collapsed into the corresponding higher level sequence.

As illustrated in FIGS. 3-7, transactions that are temporally ordered in simulation time may be selected and expanded or collapsed to facilitate the ability of a user to visualize related test bench transactions and to debug the DUT.

Figure 8:
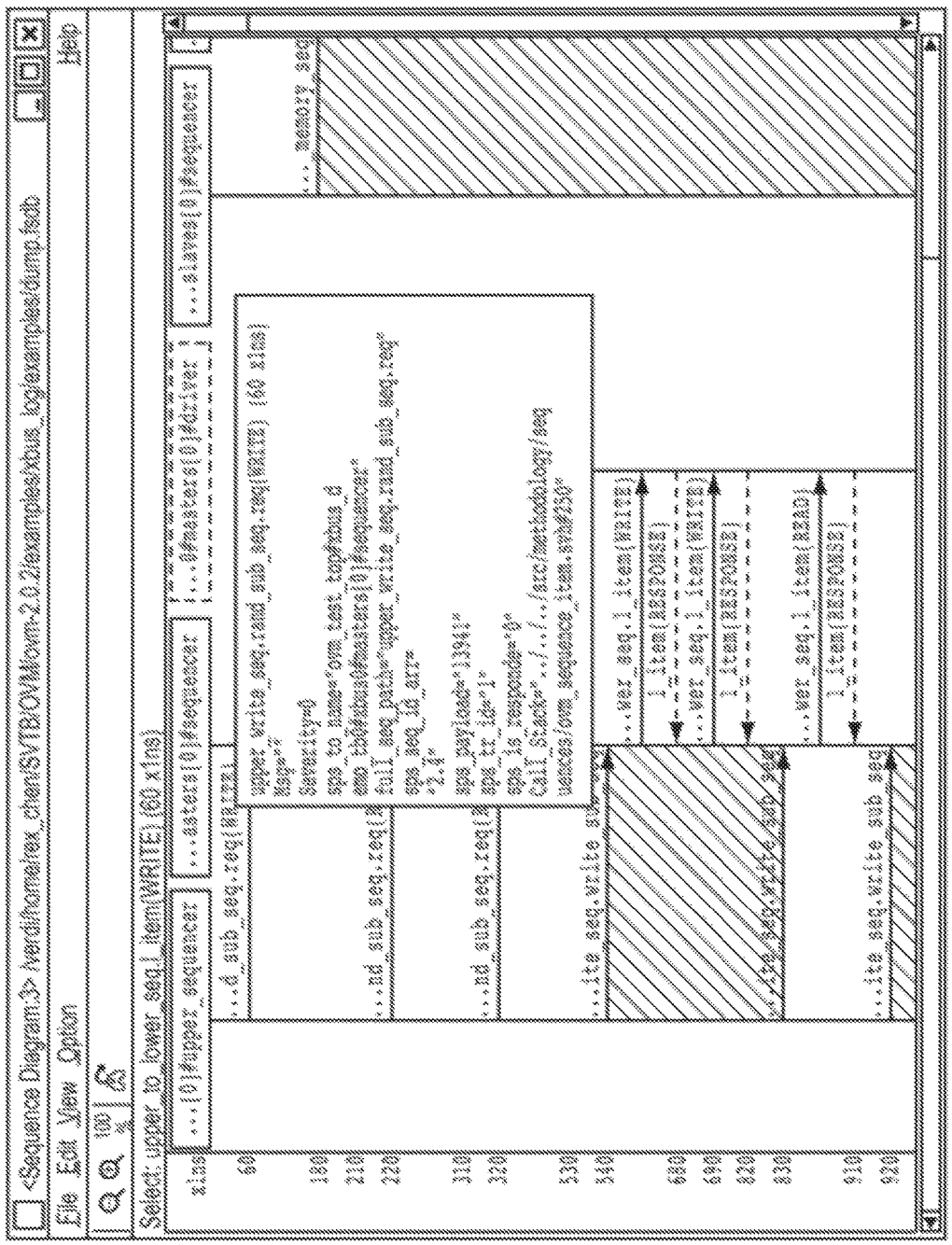
FIG. 8 illustrates a view showing attributes (detailed transaction information) for a selected transaction superimposed on the sequence diagram.

In certain embodiments, additional details or attributes of a specific transaction may be displayed by selecting a specific transaction. This feature is shown in FIG. 8, where the additional details or attributes of the transaction "d_sub_seq.req(WRITE)" at time 60 are displayed in an overlay when the user selects the transaction.

Figure 9:
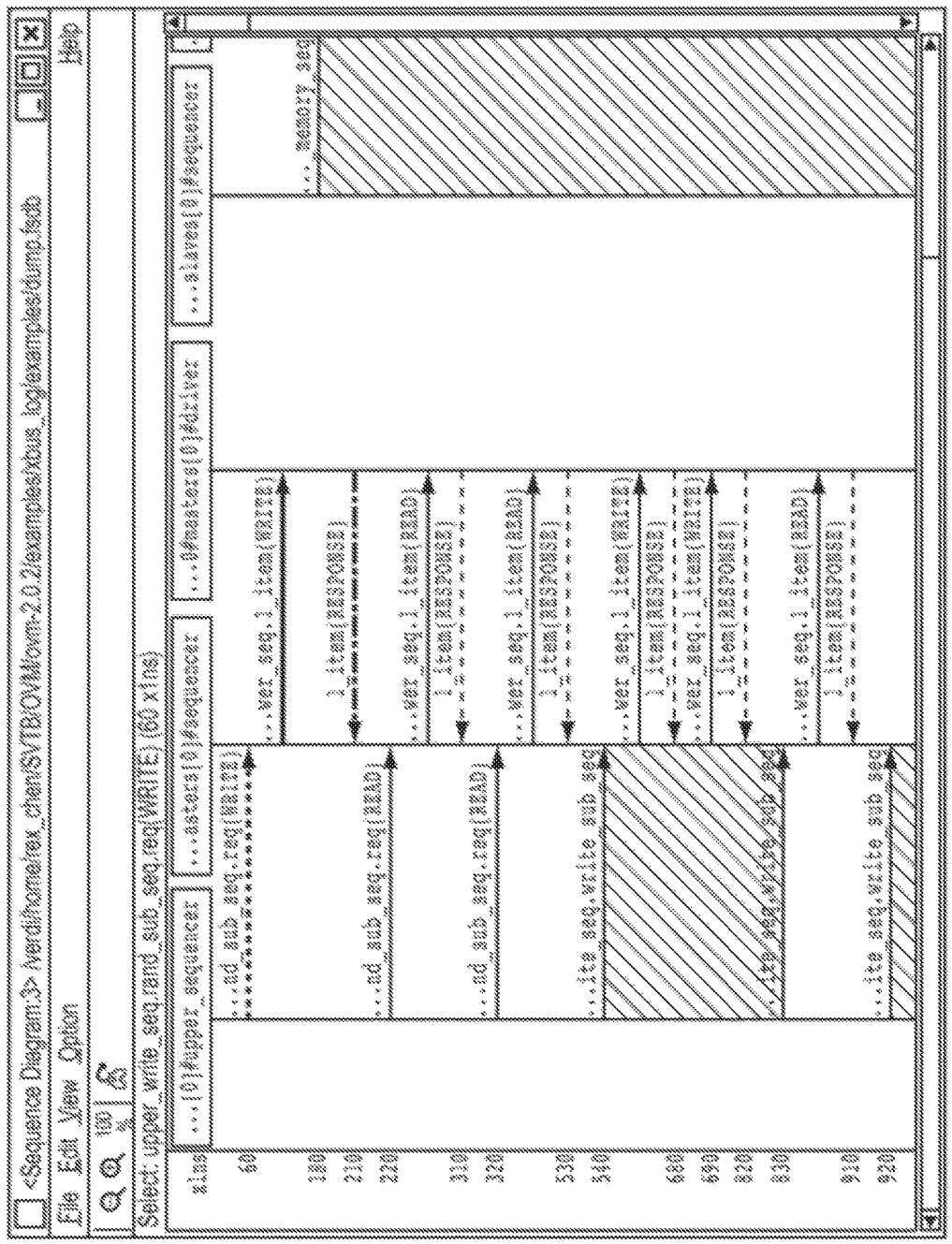
FIG. 9 illustrates visualization of related transactions that are contiguous in simulation time.
Figure 10:
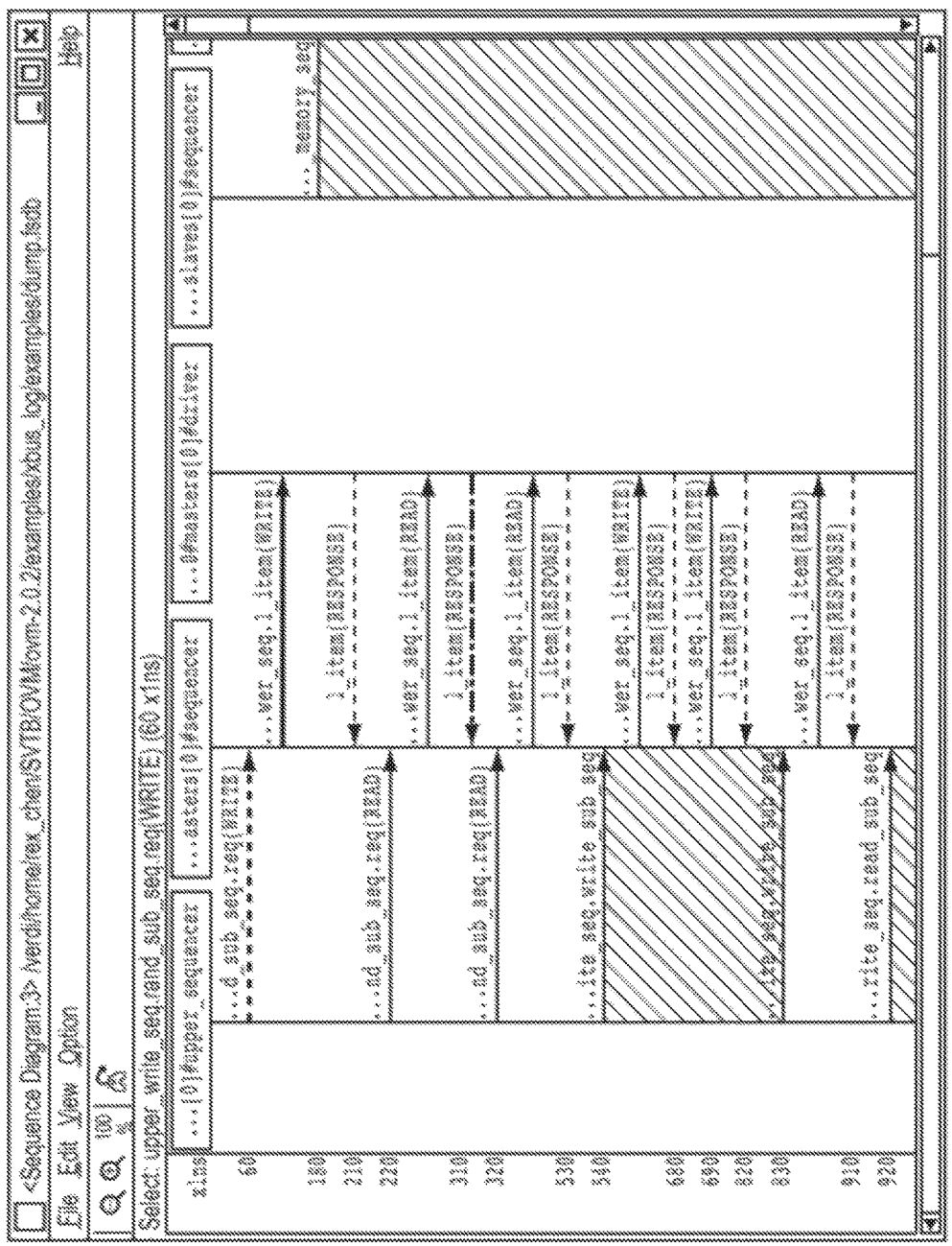
FIG. 10 illustrates visualization of related transactions that are non-contiguous in simulation time.

Related transactions may also be identified by selecting a specific transaction. For example, as shown in FIG. 9, selecting transaction "d_sub_seq.req(WRITE)" at time 60 causes the related write transaction "wer_seq.1_item (WRITE)" and response transaction "1_item(RESPONSE)" to be highlighted as solid horizontal and dashed lines, respectively. Also, as shown in FIG. 10, related transactions may be highlighted (see bold solid and dashed horizontal lines) even though the related transactions may not be contiguous in simulation time. In the figures, highlighting is indicated by bold solid and dashed lines. Alternatively, transactions may be highlighted using different colors or using other appropriate demarcation.

Figure 11A:
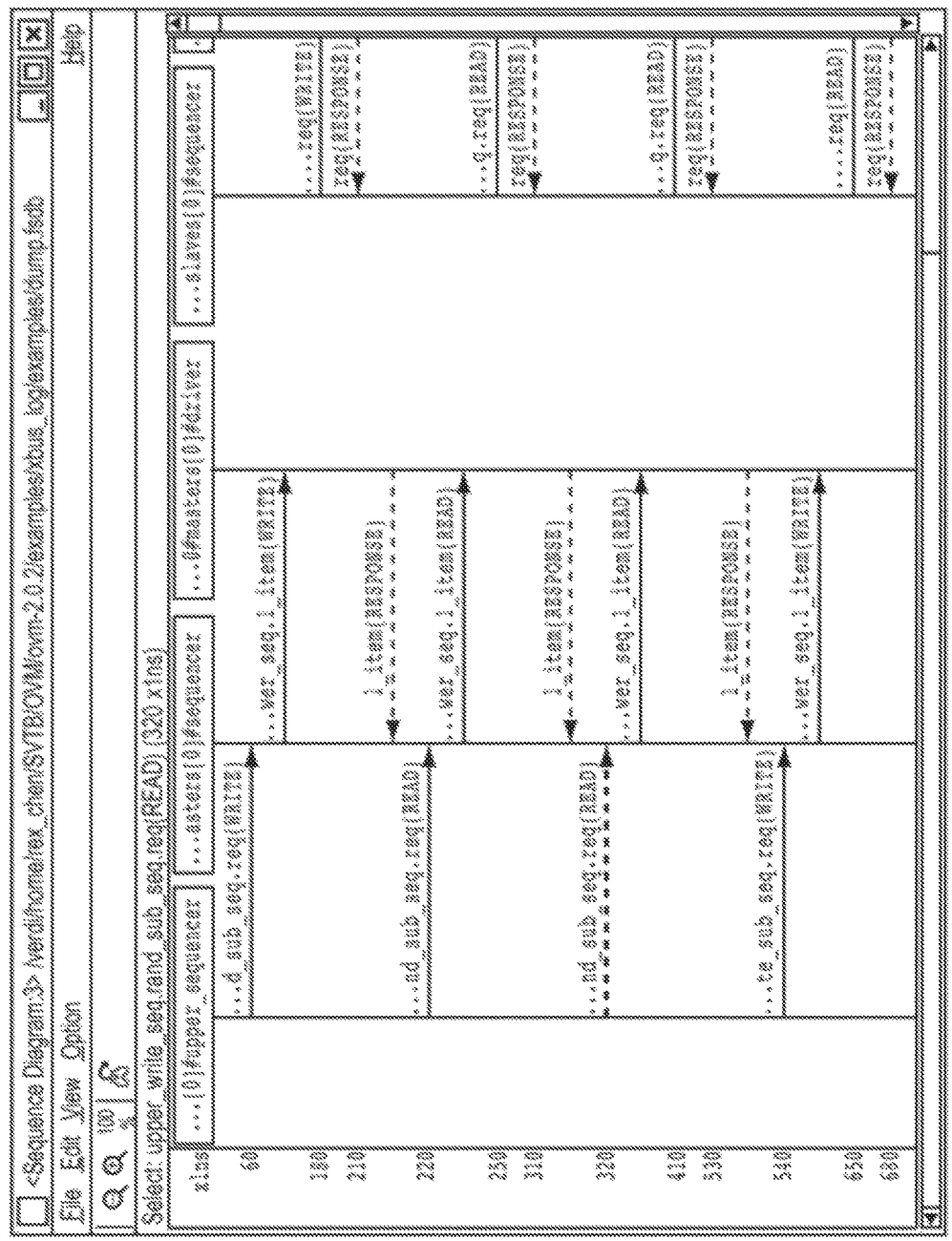
FIG. 11A illustrates tracing a transaction backward in time and FIG. 11B illustrates tracing a transaction forward in time.
Figure 11B:
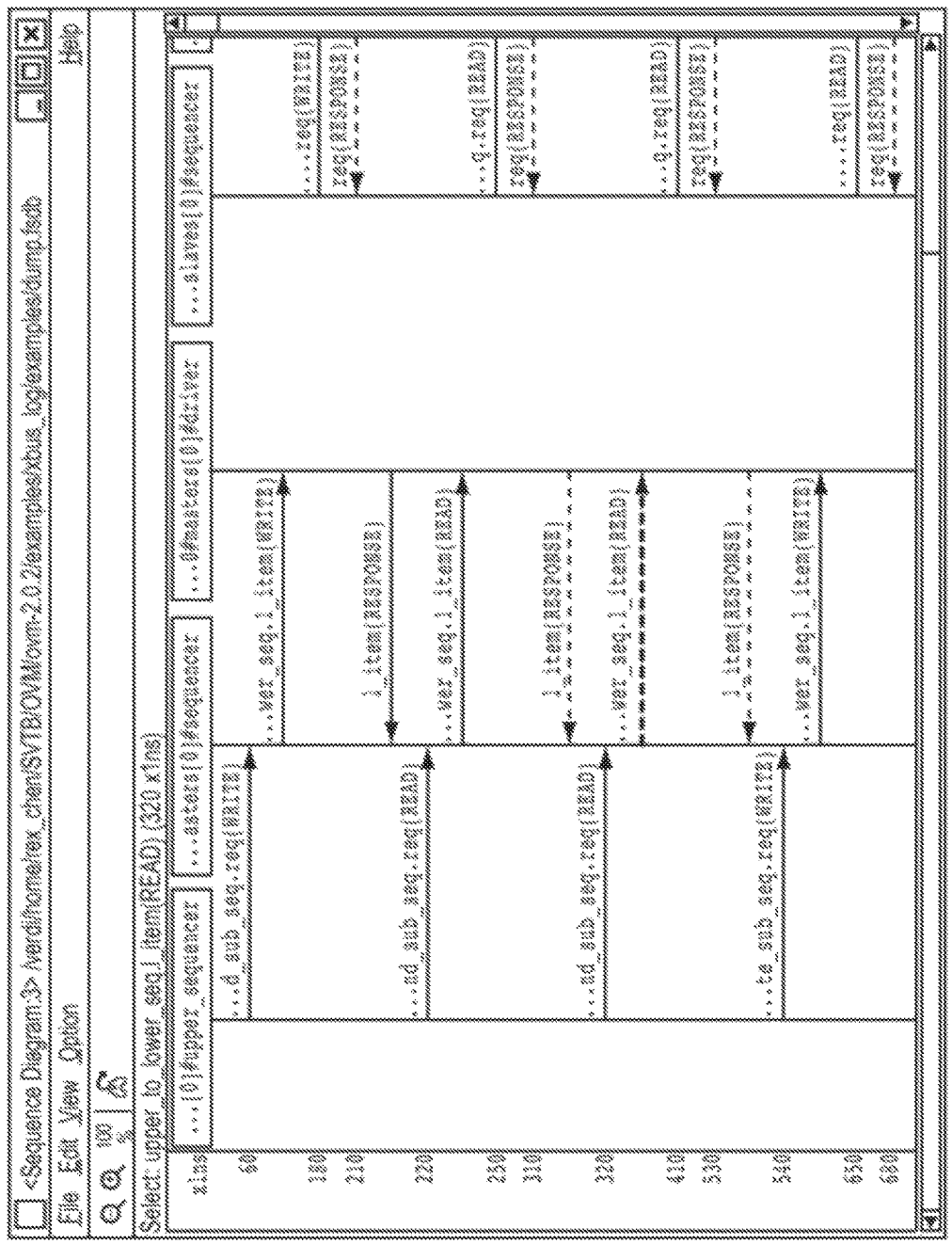

In certain embodiments, related transactions may be traced forward or backward in time. By selecting a specific transaction, a related transaction that initiated a selected transaction may be identified or a related transaction that was prompted by a selected transaction and occurs later in time may be identified. The selected transaction and the related transaction(s) may be identified, for example, by color. For example, as illustrated in FIG. 11A and FIG. 11B, by selecting a specific transaction, in this case, "wer_seq.1_item(READ)", between components . . . masters[0]#sequencer and . . . 0#masters[0]#driver in FIG. 11A, the related transaction "nd_sub_seq.req(READ)", which occurs earlier in time, becomes highlighted (bold dashed lines). Similarly, as shown in FIG. 11B, related transactions may also be traced forward in time, where selecting transaction " . . . nd_sub_seq.req(READ)" highlights related transaction " . . . wer_seq.1_item(READ)", which occurs later in time.

Figure 12:
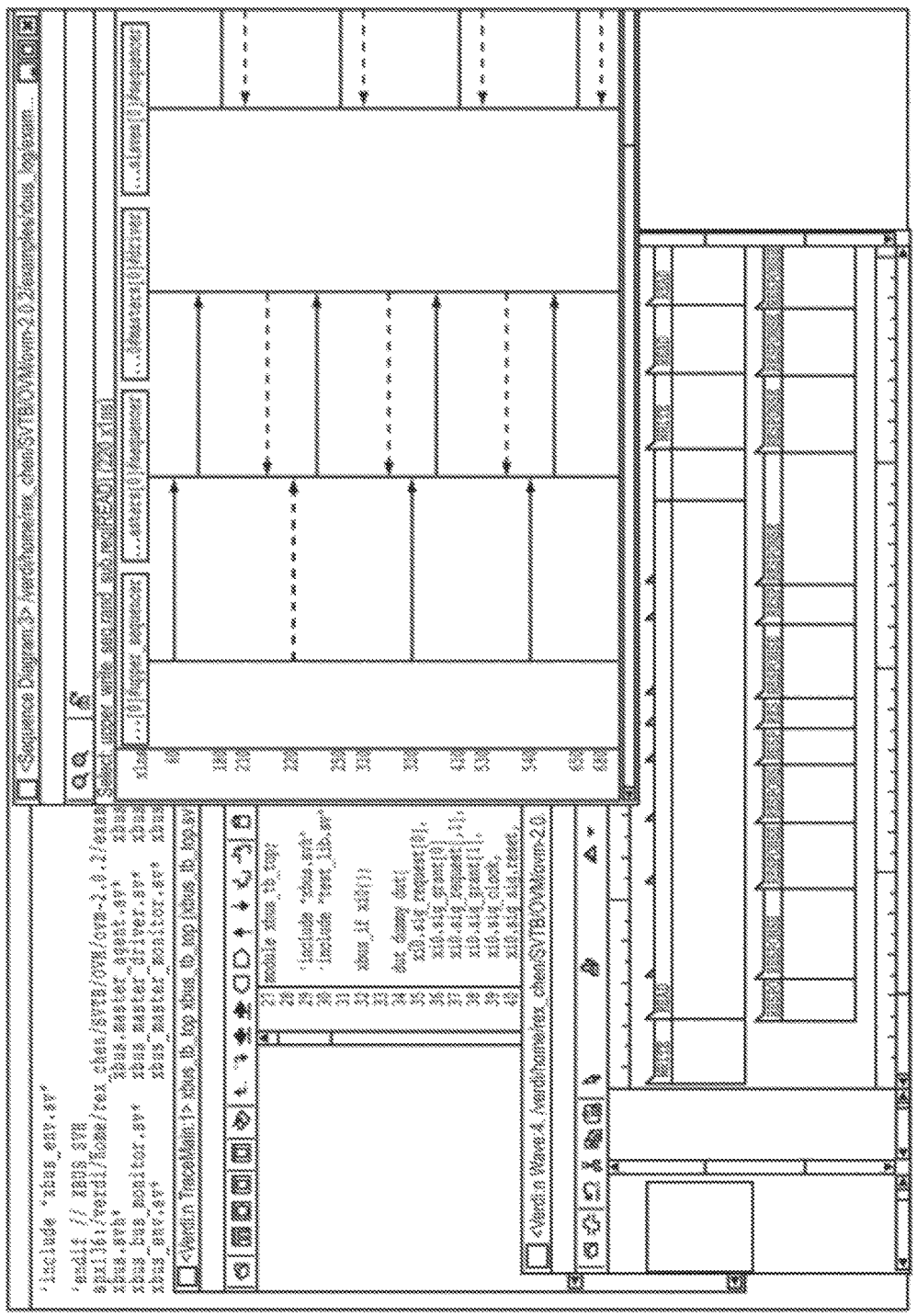
FIG. 12 illustrates the simultaneous display of a source code view of a simulation (upper left window), a waveform view of the simulation (lower window), and a sequence diagram view of the simulation (upper right window), where the different views are synchronized to show information for a particular transaction in simulation time.

To further facilitate the ability of a user to debug a DUT, a sequence diagram view may be synchronized to and displayed with one or more other views of the simulation such as the source code view and/or the waveform view. The simultaneous display of the source code view (upper left window), the waveform view (lower window), and the sequence diagram view (upper right window) for a simulation is illustrated in FIG. 12. The views are synchronized to display information about the test bench and transactions at a particular time during the simulation. The sequence diagram view may be synchronized with other views of the simulation such as a waveform view so that the selection of a particular transaction on the sequence diagram view may cause a cursor to move to a position in the waveform view corresponding to the time during the simulation at which the transaction takes place. Because views of both the hardware activity and the sequence diagram view may be obtained from the simulation, the views may be synchronized in simulation time and correlated to provide the user with additional information useful, for example, to debug a DUT. By combining the hardware and software views to show the details of the interface, such as the SystemVerilog interface, that is used to connect the test bench to the hardware, the user may understand how the relationship between the hardware and the software influences the performance of the DUT.

Figure 13:
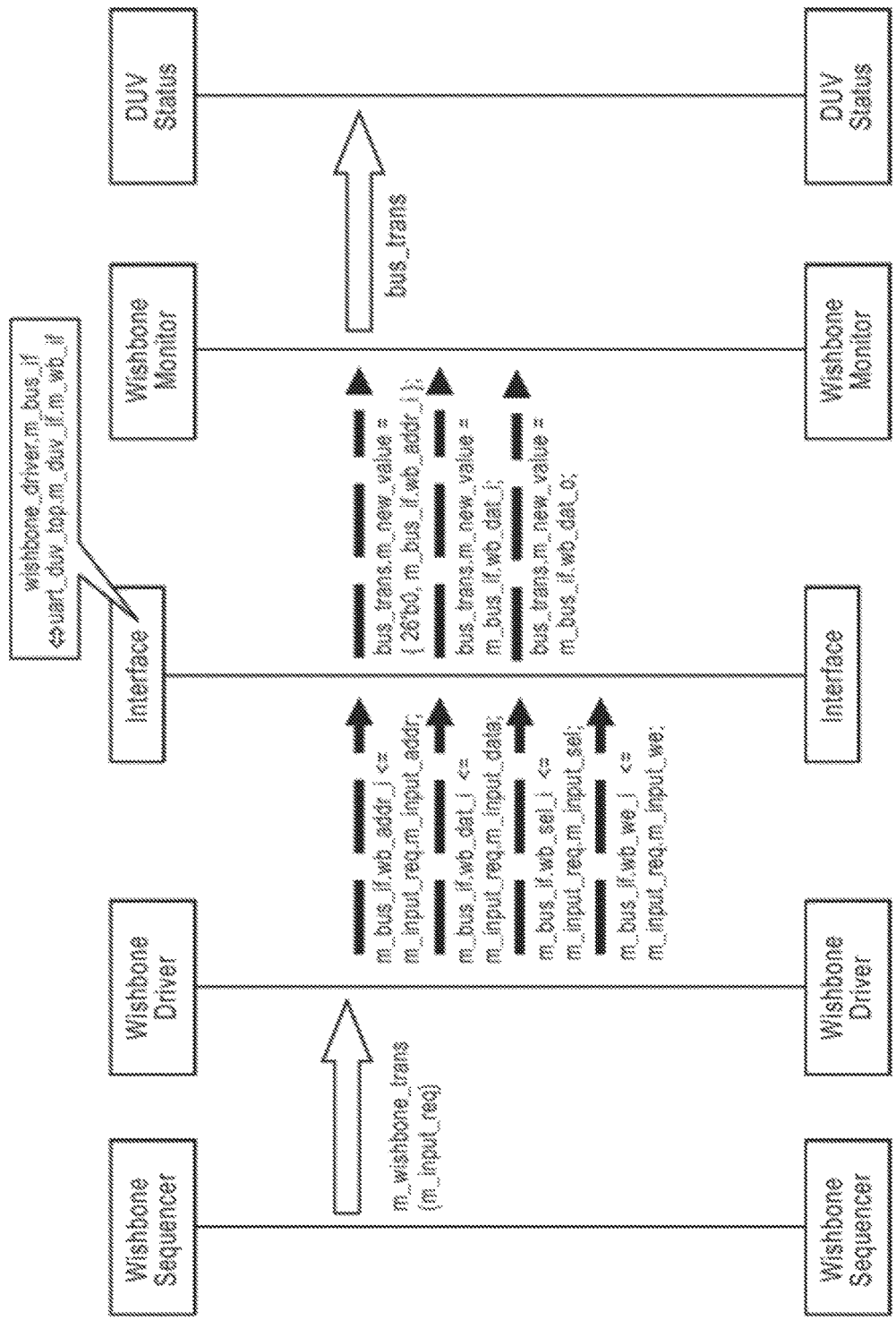
FIG. 13 illustrates the interface between the test bench and the device under test.
Figure 14:
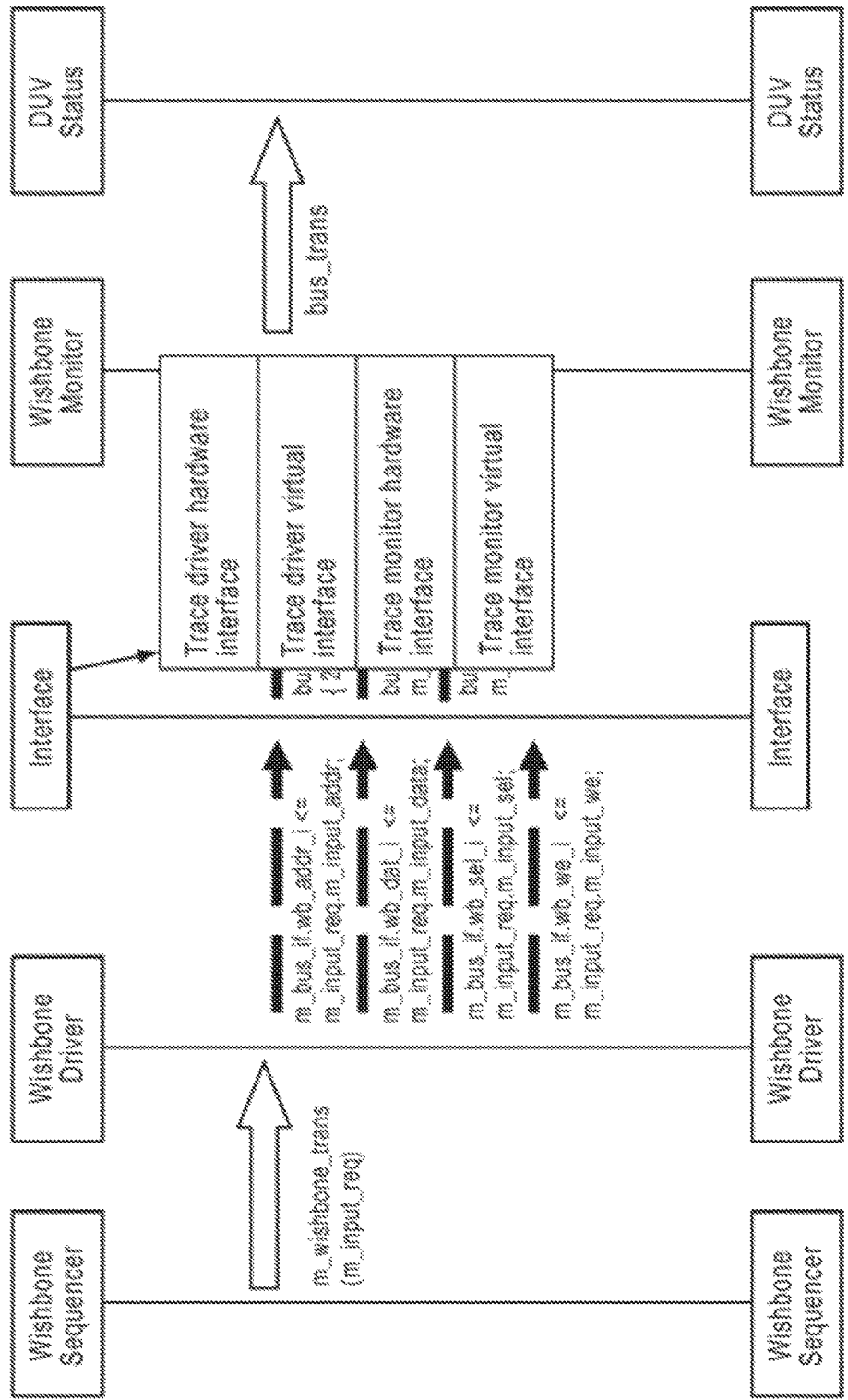
FIG. 14 illustrates a menu overlay used to access different hardware and test bench interfaces.
Figure 15:
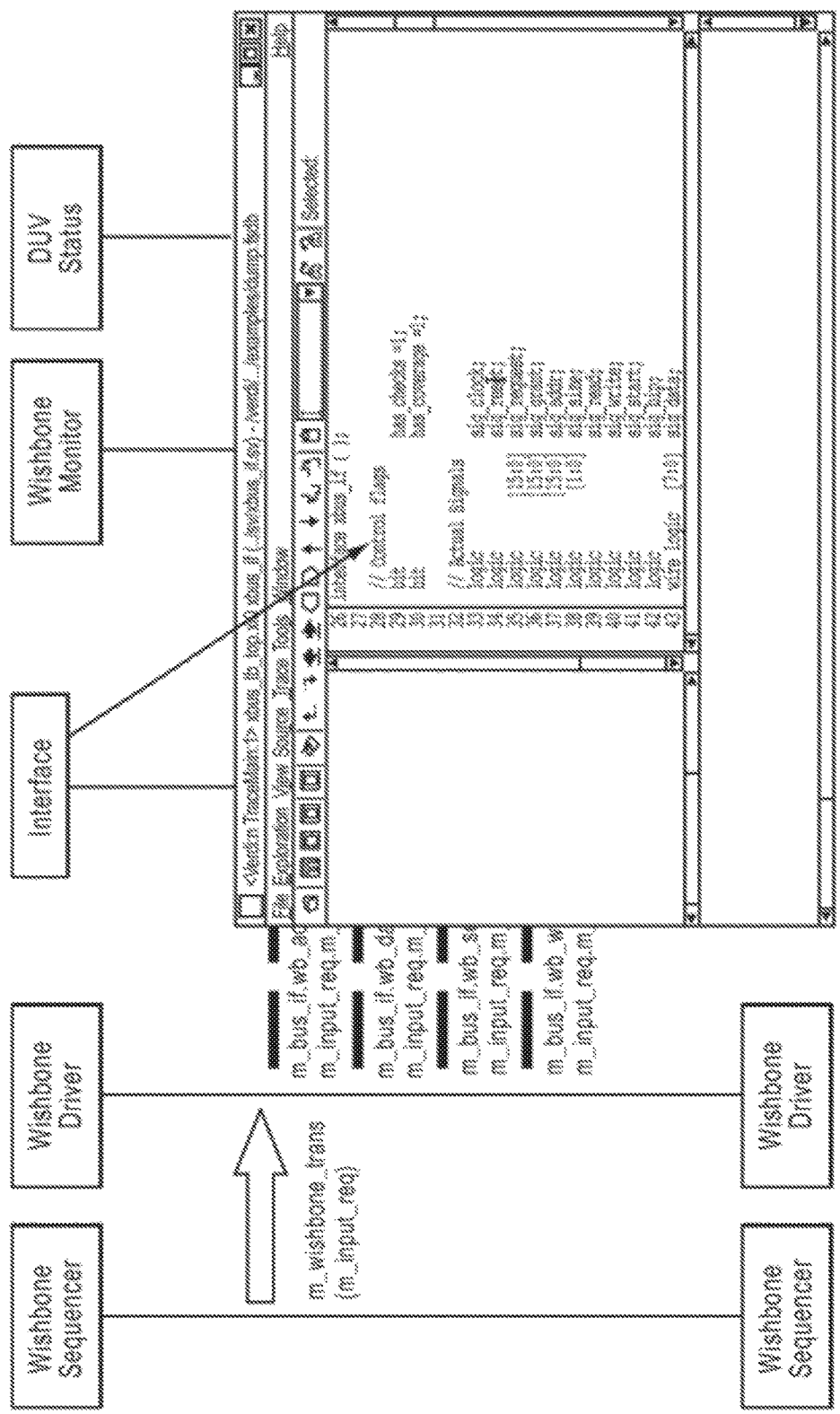
FIG. 15 illustrates display of the SystemVerilog source code in response to a user request for executing a trace driver/monitor hardware interface command.
Figure 16:
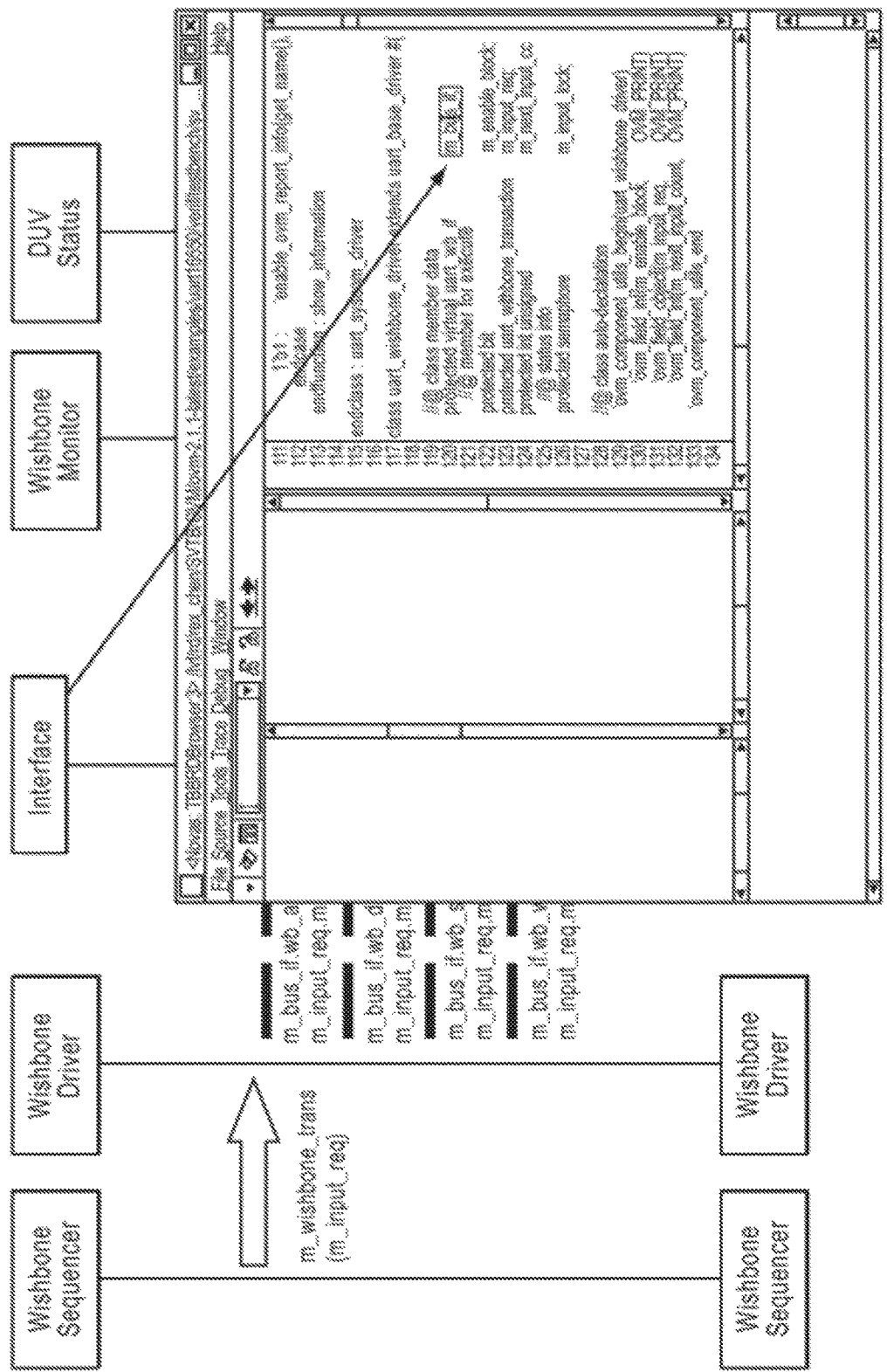
FIG. 16 illustrates display of the SystemVerilog source code in response to a user request of executing a trace driver/monitor virtual interface command.

In general, the test bench and the hardware design are inter-related by the hardware interface. By incorporating hardware interface information into a sequence diagram users may trace test bench transactions into the corresponding hardware interface signals. For example, FIG. 13 illustrates a sequence diagram view for a communication between a sequencer and a driver and incorporates the interface showing the mappings between the test bench and the hardware in terms of input and output ports. The mappings, represented by the dashed lines in FIG. 13, may show the test bench functions only (as illustrated), or may show the values of the signals sent to the ports. In certain embodiments, the interface may be implemented to provide a menu to access displays of specific interfaces. As shown in FIG. 14, specific interfaces include, for example, the driver/hardware interface, the driver virtual interface, the monitor/hardware interface, and the monitor virtual interface. FIG. 15 shows the hardware interface corresponding to the transactions of a selected driver. FIG. 16 shows the virtual interface corresponding to the transactions of a selected driver.

The OVM sequence diagram view exhibits several attributes that distinguish it from other test bench simulation views such as the UML sequence view and the TFV view. A typical design and verification environment includes both hardware (device under test) and the simulation software (test bench). The waveform and TFV views provide visualizations of the hardware activity. However, the sequence diagram view provided by the present disclosure provides a visualization of the test bench activity. The simulation data used to render the sequence diagram is automatically generated from a supported simulator without the need for user intervention as is required, for example, to obtain UML sequence views. Another advantage of the sequence diagram view is that the transactions are displayed in absolute simulation time, whereas software operations in a UML sequence view are only displayed relative in time to other operations.

In certain embodiments, methods provided by the present disclosure include running a test bench simulation comprising transactions on a device under test, wherein the device under test comprises multiple components, generating a transaction database as a response to the simulation, wherein the transaction database comprises transaction-specific data elements for a specific transaction; generating a sequence diagram from the transaction database, wherein an element of the sequence diagram comprises a temporal relationship between two or more of the transaction-specific data elements; and displaying the sequence diagram, wherein the displayed sequence diagram comprises at least two components and transactions between the at least two components arranged temporally.

In certain embodiments, apparatus provided by the present disclosure include a simulator for simulating transactions on a device under test, wherein the simulated transactions comprise multiple test bench components; a transaction database for storing simulation results from the simulator, wherein the transaction database comprises transaction-specific data elements for a specific transaction; a sequence diagram generator for generating a sequence diagram from the transaction database, wherein an element of the sequence diagram comprises a temporal relationship between two or more of the transaction-specific data elements between the test bench components; and an output device for displaying the sequence diagram, wherein the displayed sequence diagram comprises an image of at least two test bench components and transactions between the at least two test bench components arranged temporally.

In certain embodiments, an apparatus provided by the present disclosure includes a waveform view generator for generating a waveform view of the transaction-specific data elements for the simulation.

In certain embodiments, an apparatus provided by the present disclosure includes an input device for selecting a displayed transaction. The input device may be used, for example, to expand or collapse a transaction, to trace a transaction forward or backward in time, and/or to identify related transactions.

An apparatus provided by the present disclosure may also include a source code database for the simulation; a source code view generator for generating a source code view of the simulation from the source code database; a synchronizer for synchronizing the source code view of the simulation with the sequence diagram; and an output device for displaying the synchronized source code view and the sequence diagram. An apparatus may include a waveform view generator for generating a waveform view of the simulation from the transaction database; a synchronizer for synchronizing the waveform view of the simulation with the sequence diagram; and an output device for displaying the synchronized waveform view of the simulation and the sequence diagram. In certain embodiments, the synchronized views and the sequence diagram may be displayed on the same output device. The output device may also be used to display a test bench interface relating the simulation source code to the input and output ports for the test bench.

Figure 20:
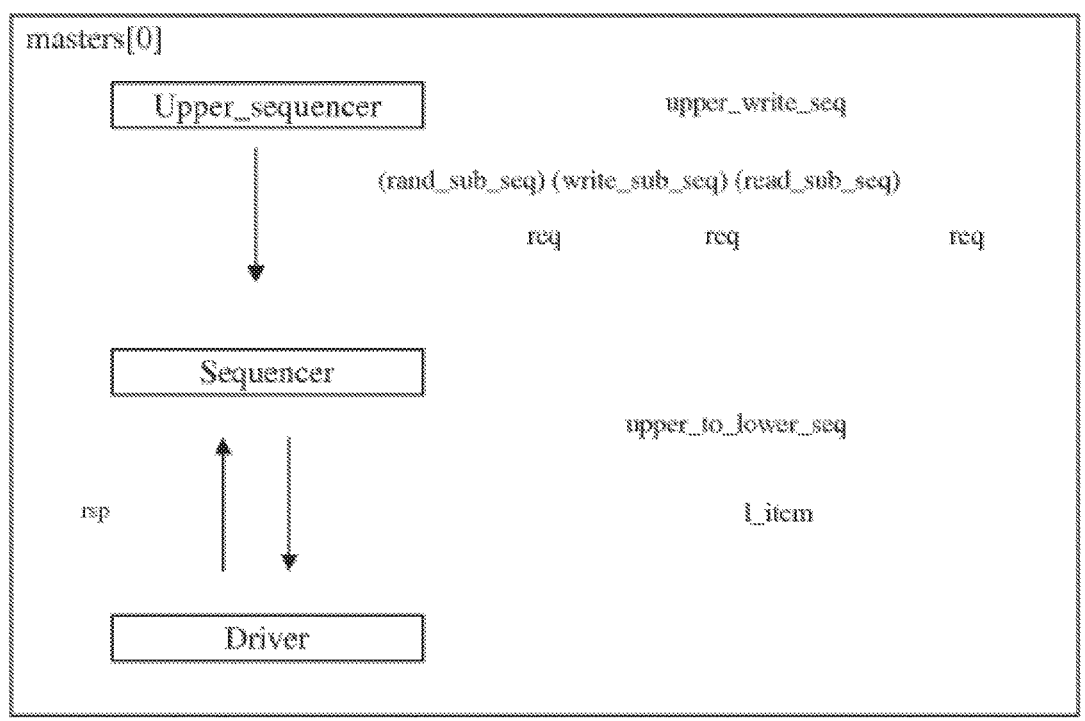
FIG. 20 illustrates an example process used to generate transaction-specific data.

An example of a process used to generate transaction-specific data is summarized in FIG. 20.

In this example, there are three components; an upper_sequencer, a sequencer, and a driver in the agent masters[0]. First, the upper_sequencer sends sequence "upper_write_seq" to the sequencer. The sequence "upper_write_seq" contains three sub-sequences: "rand_sub_seq", "write_sub_seq", and "read_sub_seq". Each sub-sequence contains a sequence item "req". When the sequencer receives the sequence item "req", the sequencer converts the sequence item into sequence "upper_to_lower_seq" and sends it to the driver. The sequence "upper_to_lower_seq" contains sequence item "1_item". When the driver receives sequence item "1_item", the driver makes a copy, renames it "response_item" and sends the renamed sequence item "response_item" back to the sequencer.

An example of code elements enabling the process described in the table are provided as follows:

```
class upper_write_seq extend ovm_sequence {
        rand_sub_seq rand_sub_seq_handle;
        write_sub_seq rand_sub_seq_handle;
        read_sub_seq rand_sub_seq_handle;
`ovm_sequence_utils(upper_write_ seq, xbus_master_upper_sequencer)
    virtual task body( ){
        OVM_DO(rand_sub_seq_handle);  → Send a rand_sub_seq sub-sequence now
        OVM_DO(write_sub_seq_handle); → Send a write_sub_seq sub-sequence now
        OVM_DO(read_sub_seq_handle);  → Send a read_sub_seq sub-sequence now
    }
};
class rand_sub_seq extend ovm_sequence {
        req req_handle;
`ovm_sequence_utils(rand_sub_seq, xbus_master_upper_sequencer)
    virtual task body( ){
            OVM_DO(req_handle); → send a req "sequence item" now
    }
}
class write_sub_seq extend ovm_sequence {
        req req_handle;
`ovm_sequence_utils(write_sub_seq, xbus_master_upper_sequencer)
    virtual task body( ){
            OVM_DO(req_handle); → send a req "sequence item" now
    }
}
class read_sub_seq extend ovm_sequence {
        req req_handle;
`ovm_sequence_utils(read_sub_seq, xbus_master_upper_sequencer)
    virtual task body( ){
            OVM_DO(req_handle); → send a req "sequence item" now
    }
}
class req extend ovm_sequence_item {
}
class myTest extend ovm_test {
virtual function void build( );
    // → send a upper_write_seq "sequence" in myTest
    set_config_string("xbus_demo_tb0.xbus0.masters[0].upper_sequencer",
        "default_sequence", "upper_write_seq");
        super.build( );
    endfunction : build
}
class sequencer extend ovm_sequencer {
}
class upper_to_lower_seq extend ovm_sequence {
            `ovm_sequence_utils(upper_to_lower_seq, xbus_master_upper_sequencer)
}
class 1_item extend ovm_sequnce_item {
}
class driver extend ovm_driver {
}
```

Referring to the above codes, a simulation is initiated from "myTest" when the upper_sequencer sends the "upper_write_seq" sequence to the sequencer. When OVM_DO is invoked, transaction-specific data elements including the starting time, ending time, and "stream" name of the transaction are automatically created and recorded in a signal value change file in the FDSB. The transaction "stream" name is used to determine which transaction "fiber" is to display the transaction. In addition, the following attributes, which may be used to construct the sequence diagram, are also recorded in FSDB;

sps_to_name; The destination of a sequence or sequence item;

full_seq_path: The full sequence name of a OVM sequence or sequence item;

sps_seq_id_arr: The identification array of a sequence or sequence item;

sps_payload: Used to highlight related sequences;

sps_tr_id: Unique identification for a sequence item; and sps_is_response: Mark response item.

Component upper_sequencer is connected to sequencer through a port by the user test bench code. At an appropriate time, the upper_sequencer sends a "req sequence_item" to the port and is then received by the sequencer. The sequencer converts the "received req" sequence item to "upper_to_lower_sequence". The sequencer then sends "1_item" to a driver through another port.

The sequencer is connected to the driver through another port by the user test bench code. When the driver receives a "1_item", it makes a copy, renames it "response_item", and sends "response_item" to the sequencer. The main task performed by the driver is to set signal values on certain DUT input ports according to the data in "1_item", e.g., the driver drives the inputs on the DUT based on the sequence items it receives.

An example of steps for generating a sequence diagram are as follows:

Traverse each stream stored in the FSDB file. Each stream represents a component in the sequence diagram. For example, there are four stream names, namely, sequencer, driver, monitor and reference model. These streams are the components of the sequence diagram;

Identify the driver component and the monitor component, and establish the interface between the driver and the monitor;

Analyze source codes and locate the statements between driver/interface and monitor/interface;

Traverse each transaction on the stream. A transaction may be associated with a component by the "sps_to_name" attribute;

For transactions on the same component, determine whether the transactions may be collapsed by the "sps_seq_id_arr". For example, if there are two transactions in which "sps_seq_id_arr" are "1.2" and "1.3", then they may be collapsed because the transactions share the same parent sequence "1";

If the attribute "sps_payload" is assigned values and is associated with transactions between different components, a user may highlight the transactions displayed on the sequence diagram by selecting one of the transactions; and If the attribute "sps_is_response" is 1, the corresponding transaction is a response from driver.

An example of steps for displaying a sequence diagram are as follows:

Draw the components horizontally on the top of the sequence diagram;

Draw the time line vertically on the left of the sequence diagram;

For each component, draw the collapsed transactions from the source component to the destination component;

Draw the function names between the driver/interface and the monitor/interface; and Drag and drop the statements to the TBBR source code window.

Figure 17:
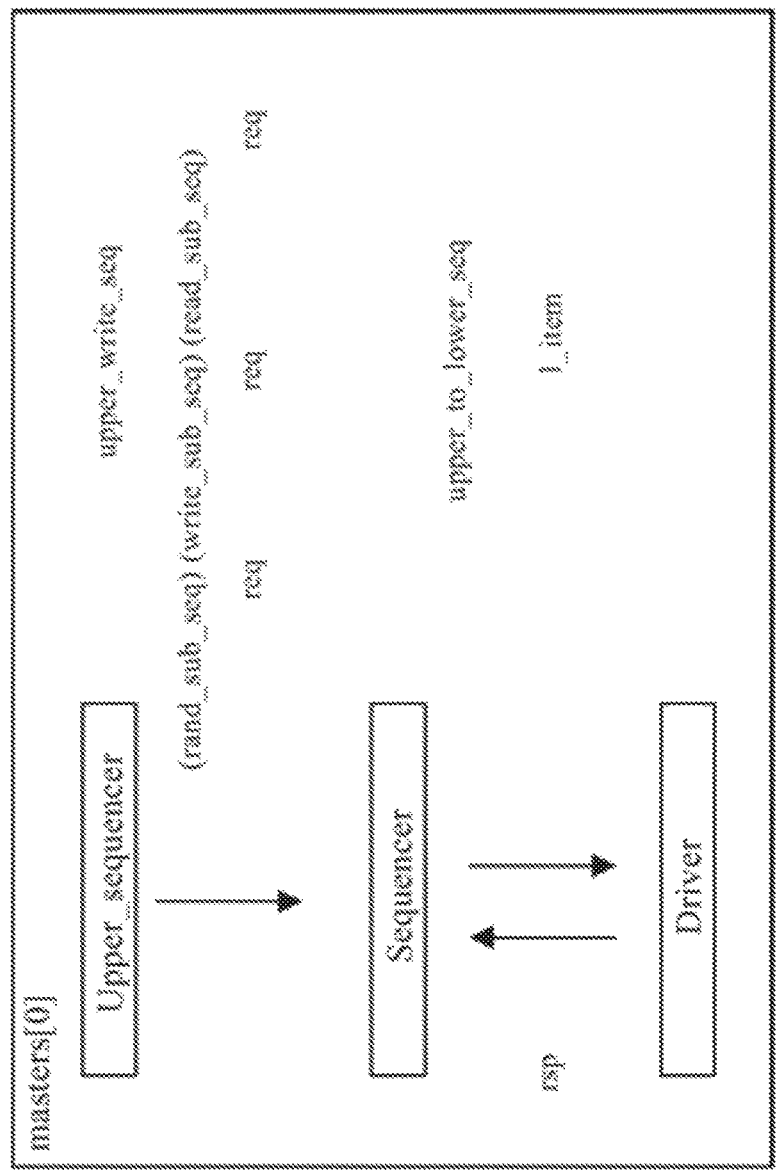
FIG. 17 illustrates details of highlighted transactions and statements for the driver/monitor interface.
Figure 18:
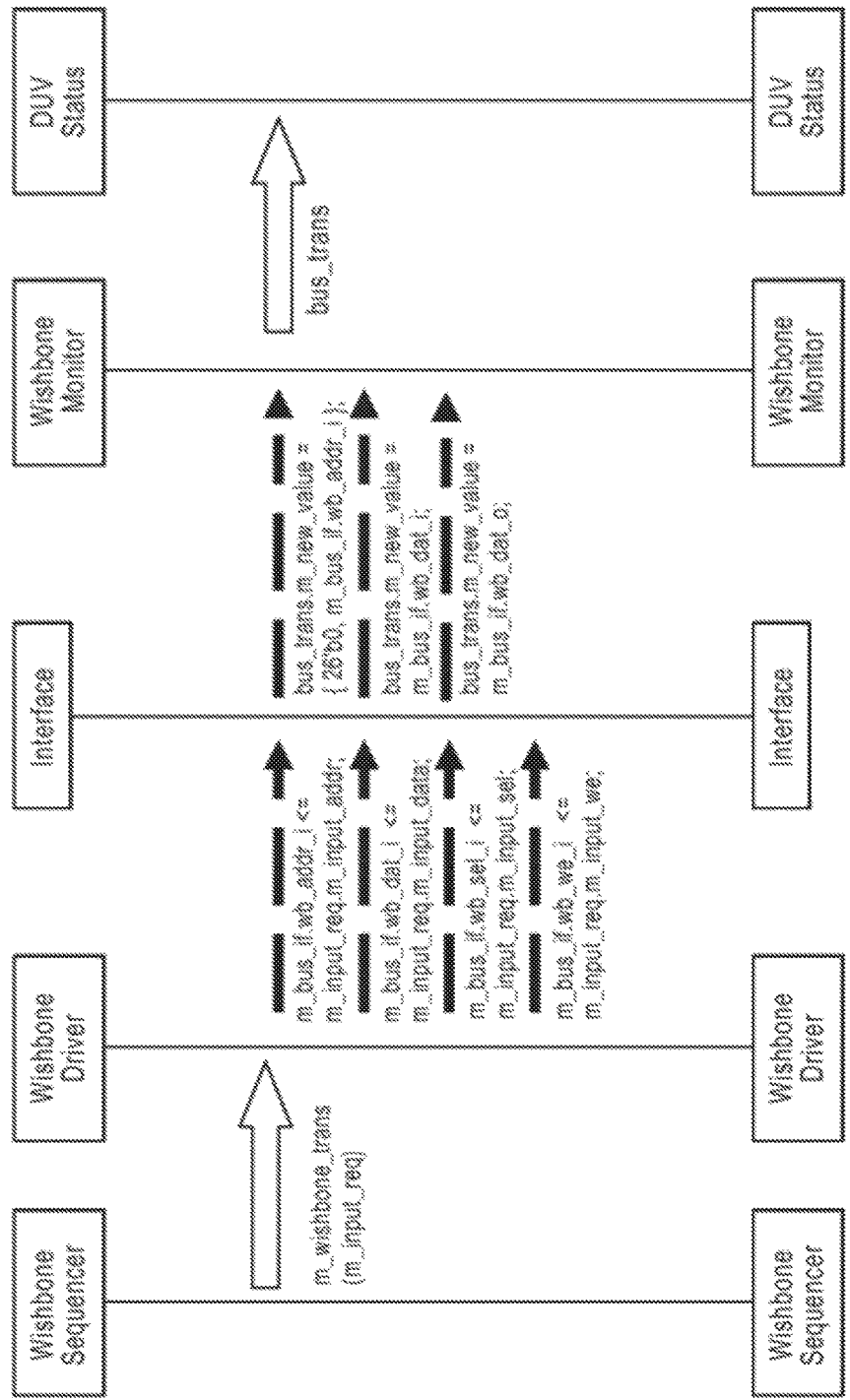
FIGS. 18 and 19 illustrate dragging and dropping highlighted transactions and statements to the TBBR source code.
Figure 19:
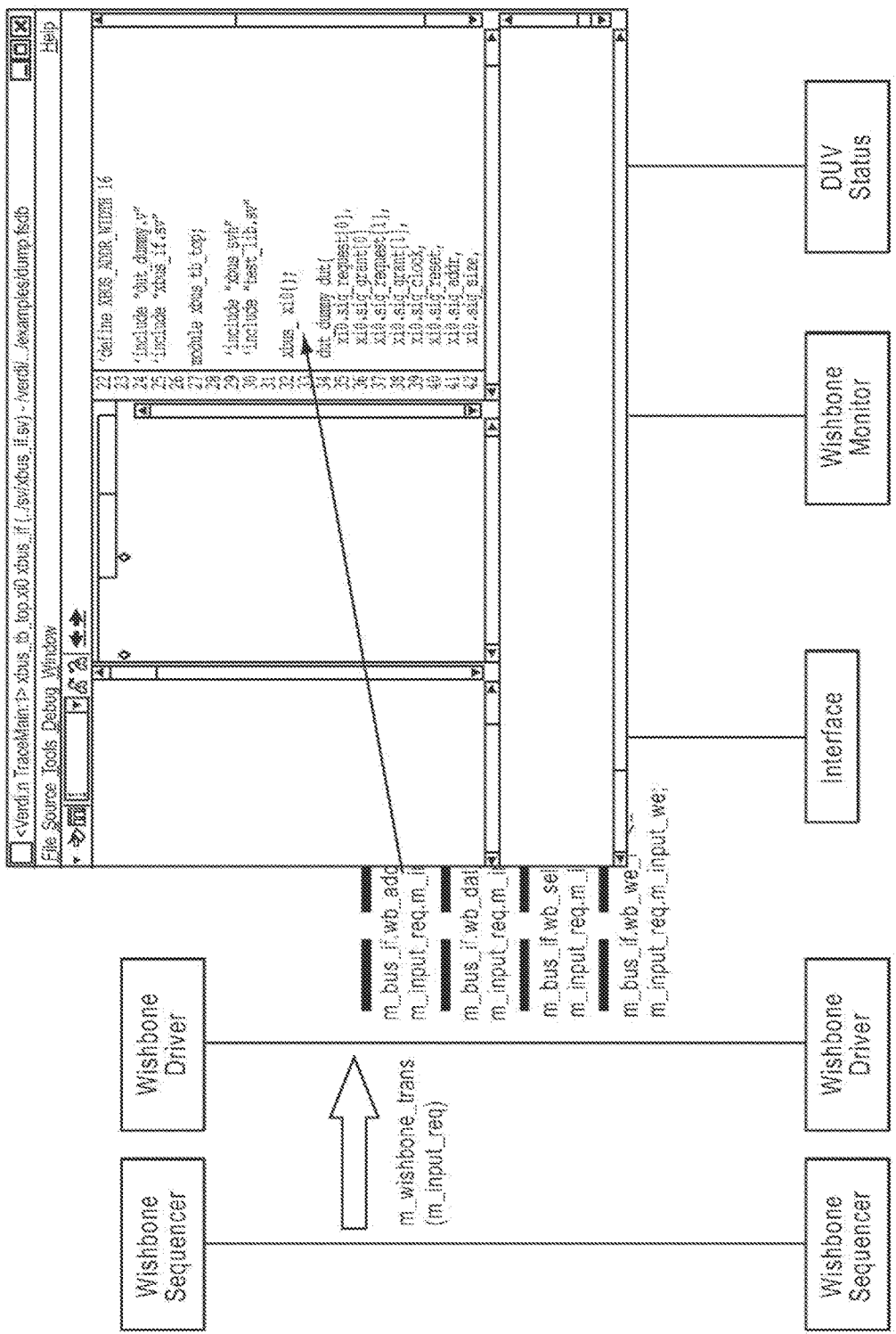

In the test bench, the driver transforms a transaction from a sequencer to signals, and then sends the signals to an interface. A monitor collects the signals from the interface and forms the signals into transactions. Therefore, there is no transaction between driver/interface and monitor/interface. To describe the transformation from transactions to signals and from signals to transactions, the names of the functions that perform the transformation between the driver/interface and the monitor/interface may be extracted from the source code (FIG. 17). These functions are written in the test bench source code (FIG. 18). Therefore, a user may drag and drop function names to the TBBR source code window to access details of the functions.

Other embodiments consistent with the present disclosure will be apparent to those skilled in the art from consideration of the specification and practice of the embodiments disclosed herein. The exact constructions of the embodiments described above and illustrated in the accompanying drawings are not meant to be limiting, and various modifications and changes may be made without departing from the scope thereof. It is intended that the scope of the disclosed embodiments only be limited by the appended claims. Furthermore, the claims are not to be limited to the details given herein, and are entitled their full scope and equivalents thereof.

What is claimed is:

1. A method, comprising:
receiving, at one or more computer systems, information generated in response to a simulation of a device under test with a test bench, the information comprising transactions and transaction passing and temporal relationships between multiple test bench components;
generating, with one or more processors associated with the one or more computer systems, a transaction database as a response to the received information; and
generating and displaying, with the one or more processors associated with the one or more computer systems, an element of a sequence diagram that visually represents both a temporal sequence between two or more data elements of a transaction between at least two test bench components and a transaction passing sequence between each of the two or more data elements according to the transaction database; wherein a transaction represented by an element in the sequence diagram is selected from data passed between two sequencers and data passed between a sequencer and a driver.

2. The method of claim 1 wherein each database transaction comprises a name of the transaction, a start time of the transaction, and an end time of the transaction.

3. The method of claim 1 wherein each database transaction comprises an interface data on which the transaction occurs.

4. The method of claim 1 wherein each database transaction comprises a name of a variable associated with the transaction, and a value for the variable at a selected time.

5. The method of claim 3 wherein the interface comprises a test bench component imitating a request and a test bench component returning a response to the request.

6. The method of claim 1 further comprising generating a waveform view of the simulation using the transaction database.

7. The method of claim 6 further comprising identifying a portion of the waveform corresponding to the time of a transaction represented by an element in the sequence diagram.

8. The method of claim 1 further comprising enabling tracing of a transaction represented by the element of the sequence diagram either forward or backward in time.

9. The method of claim 1 wherein the at least two test bench components are selected from the sequencer and the driver.

10. The method of claim 1 further comprising visually expanding a transaction represented by the element of the sequence diagram into one or more lower-level transactions.

11. The method of claim 1 further comprising collapsing one or more transactions represented by the element of the sequence diagram into a higher-level transaction.

12. The method of claim 1 further comprising displaying attributes of a transaction represented by the sequence diagram.

13. The method of claim 1 further comprising:

receiving source code for the simulation;

generating a source code database;

generating a source code view of the simulation from the source code database;

generating a synchronized source code view based on synchronizing the source code view of the simulation with the sequence diagram; and and generating information configured to display the synchronized source code view.

14. The method of claim 1 further comprising:

generating a waveform view of the simulation from the transaction database;

generating a synchronized waveform view based on synchronizing the waveform view of the simulation with the sequence diagram; and generating information configured to display the synchronized waveform view of the simulation.

* * * * *